United States Patent
Christian et al.

(10) Patent No.: US 6,684,122 B1
(45) Date of Patent: Jan. 27, 2004

(54) CONTROL MECHANISM FOR MATCHING PROCESS PARAMETERS IN A MULTI-CHAMBER PROCESS TOOL

(75) Inventors: Craig W. Christian, Buda, TX (US); Bradley M. Davis, Austin, TX (US); Allen L. Evans, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/476,892

(22) Filed: Jan. 3, 2000

(51) Int. Cl.$^7$ .............................................. G06F 19/00
(52) U.S. Cl. ........................ 700/121; 700/110; 700/28
(58) Field of Search ................................ 700/9, 11–15, 700/17–21, 28–35, 83–85, 95, 96, 108–113, 121–123

(56) References Cited

U.S. PATENT DOCUMENTS

| | | | |
|---|---|---|---|
| 5,126,028 A | 6/1992 | Hurwitt et al. | 204/192.13 |
| 5,270,222 A | 12/1993 | Moslehi | 437/8 |
| 5,536,317 A * | 7/1996 | Crain et al. | 118/64 |
| 5,555,177 A | 9/1996 | Simmons | 364/468.28 |
| 5,665,214 A * | 9/1997 | Iturralde | 204/298.03 |
| 5,715,361 A * | 2/1998 | Moslehi | 392/416 |
| 5,728,222 A * | 3/1998 | Barbee et al. | 118/715 |
| 5,812,261 A * | 9/1998 | Nelson et al. | 356/318 |
| 5,955,139 A | 9/1999 | Iturralde | 427/9 |
| 6,081,330 A * | 6/2000 | Nelson et al. | 356/318 |
| 6,303,395 B1 * | 10/2001 | Nulman | 438/14 |
| 6,316,045 B1 * | 11/2001 | Bernard et al. | 427/8 |
| 6,348,967 B1 * | 2/2002 | Nelson et al. | 356/432 |
| 6,363,294 B1 * | 3/2002 | Coronel et al. | 700/121 |

FOREIGN PATENT DOCUMENTS

JP   110163973   1/1999

OTHER PUBLICATIONS

*PCT International Search Report* dated Mar. 6, 2001, International Application No. PCT/US00/25723.

* cited by examiner

Primary Examiner—Maria N. Von Buhr
(74) Attorney, Agent, or Firm—Williams, Morgan & Amerson, P.C.

(57) ABSTRACT

The invention, in its various aspects and embodiments, is a method and apparatus for controlling the operation of a multi-chamber process tool in a semiconductor fabrication process. The method comprises setting a plurality of operation parameters for the conduct of a predetermined operation in each of a plurality of process chambers in a multi-chamber process tool; performing the predetermined operation in each of the process chambers; examining a physical characteristic of a processed wafer from each of the process chambers; determining from the examined physical characteristics whether the operating conditions in each of the process chambers match; and resetting at least one operating parameter so that the operating conditions in each of the process chambers will match. The apparatus comprises a processing tool, a review station, and a tool controller. The processing tool includes a plurality of process chambers and an operation controller. Each process chamber is capable of performing a predetermined operation defined by a plurality of operating parameters. The operation controller is capable of setting the operating parameter for each of the process chambers. The review station is capable of examining a physical characteristic of a processed wafer from each of the process chambers and outputting the results of the examination. The tool controller is capable of receiving the examination result, determining whether the operating parameters of the process chambers match, and instructing the operation controller to reset at least some of the operating parameters responsive thereto to match the operating conditions in the process chambers.

59 Claims, 4 Drawing Sheets

CONTROL MECHANISM FOR MATCHING PROCESS PARAMETERS IN A MULTI-CHAMBER PROCESS TOOL

BACKGROUND OF THE INVENTION

1. Field of the Invention

This invention pertains to semiconductor manufacturing and, more particularly, to controlling the operational parameters of a multi-chamber process tool.

2. Description of the Related Art

The semiconductor industry constantly seeks to increase quality, reliability and throughput in producing integrated circuit devices from these fabrication processes. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. Semiconductor devices, or microchips or integrated circuit devices, are manufactured from wafers of a substrate material. Layers of materials are added, removed, and/or treated during fabrication to create the integrated, electrical circuits that make up the device. The fabrication essentially comprises four basic operations. The four operations are:

- layering, or adding thin layers of various materials to a wafer from which a semiconductor is produced;
- patterning, or removing selected portions of added layers;
- doping, or placing specific amounts of dopants in the wafer surface through openings in the added layers; and
- heat treatment, or heating and cooling the materials to produce desired effects in the processed wafer.

Although there are only four basic operations, they can be combined in hundreds of different ways, depending upon the particular fabrication process. See, e.g., Peter Van Zant, *Microchip Fabrication A Practical Guide to Semiconductor Processing* (3d Ed. 1997 McGraw-Hill Companies, Inc.) (ISBN 0-07-067250-4).

The fabrication process generally involves processing a number of wafers through a series of fabrication tools. This is broadly referred to as the "process flow." Each fabrication tool performs one or more of the four basic operations. The four basic operations are performed in accordance with an overall process to finally produce wafers from which the semiconductor devices are obtained. One important aspect of the manufacturing process is process control. In particular, the fabrication tools and the fabrication environment must be controlled to achieve a satisfactory process. Certain operational parameters may be monitored and, when desired, the tool's operation can be altered to improve the process to yield more or better wafers.

Competitiveness in the semiconductor manufacturing industry is driven by increasingly complex product and process technologies and pressures on manufacturers to improve cycle time, quality, and process flexibility. Requirements for sub-quarter-micron device manufacturing and advanced batch control technologies are increasingly important. As wafer sizes increase and feature sizes shrink, equipment and facilities costs rise significantly. Advanced factory-level process control is now recognized as a vital technology for achieving the yield and productivity levels required to compete effectively, but its deployment has been limited to date by the lack of sufficient integration technology and standards.

Important characteristics in factory-level process controls include:

- scalability—can be applied to a single process tool and its dedicated metrology or across multiple interdependent process areas; the system can be installed on a single computer, or spread across a distributed platform of multiple machines, depending on the performance and reliability requirements;
- compatibility with existing systems—designed and validated to work with today's manufacturing systems;
- flexibility—control functions are not "hard-wired" into the architecture, but rather embodied in the scripts and control application "plug-ins"; and
- standards-based—components communicate among themselves using standardized protocols Still other factors may become important, and perhaps even predominate, depending on the context of a particular implementation.

The failure of current process controls to adopt these characteristics engenders numerous inefficiencies. Traditional process control has been what is known as statistical process control ("SPC"). SPC usually detects only two types of process problems. An abrupt change in process behavior or incoming material will be flagged when one or two SPC data points fall near or outside the SPC control limits. For example, a shift in a process will be detected by SPC rules that look for four out of five points more than one sigma away from the process mean, or eight consecutive points all on one side of the process mean. SPC systems typically provide for corrective actions to be defined for each of their rules. Abrupt changes will elicit an indication that there is a problem, prompting for manual identification and resolution.

Thus, one area in which to seek improvements is in process control. Each of the four operations listed above requires controlling numerous parameters, as does the overall fabrication process. Among the parameters it would be useful to monitor and control are critical dimensions ("CDs") and doping levels for transistors (and other semiconductor devices), as well as overlay errors in photolithography. CDs are the smallest feature sizes that particular processing devices may be capable of producing. For example, the minimum widths w of polycrystalline ("polysilicon" or "poly") gate lines for metal oxide semiconductor field effect transistors ("MOSFETs" or "MOS" transistors) may correspond to one CD for a semiconductor device having such transistors. Similarly, the junction depth $d_j$ (depth below the surface of a doped substrate to the bottom of a heavily doped source/drain region formed within the doped substrate) may be another CD for a semiconductor device such as an MOS transistor. Doping levels may depend on dosages of ions implanted into the semiconductor devices, the dosages typically being given in numbers of ions per square centimeter at ion implant energies typically given in kilo-electronVolts ("keV").

Despite the advances made in this area, many of the processing tools that are currently commercially available suffer certain deficiencies. In particular, such tools often lack advanced process data monitoring capabilities, such as the ability to provide historical parametric data in a userfriendly format, as well as event logging, real-time graphical display of both current processing parameters and the processing parameters of the entire run, and remote, i.e., local site and worldwide, monitoring. These deficiencies can engender nonoptimal control of critical processing parameters, such as throughput accuracy, stability and repeatability, processing temperatures, mechanical tool parameters, and the like. This variability manifests itself as within-run disparities, run-to-run disparities and tool-to-tool disparities that can propagate into deviations in product quality and performance.

However, the traditional SPC techniques are often inadequate to control precisely CDs and doping levels in semiconductor and microelectronic device manufacturing to optimize device performance and yield. Typically, SPC techniques set a target value, and a spread about the target value, for the CDs, doping levels, and/or overlay errors in photolithography. The SPC techniques then attempt to minimize the deviation from the target value without automatically adjusting and adapting the respective target values to optimize the semiconductor device performance, as measured by wafer electrical test ("WET") measurement characteristics, for example, and/or to optimize the semiconductor device yield and throughput. Furthermore, blindly minimizing non-adaptive processing spreads about target values may not increase processing yield and throughput.

One example of this lack of control may be found in multi-chamber processing tools. Many fabrication tools contain multiple operation chambers, sometimes as many as six, conducting the same operation on different wafers. For example, a chemical vapor deposition ("CVD") tool might have six wafers undergoing treatment in six different deposition chambers. The deposition process should, ideally, result in wafers having the same critical characteristics. In the case of the CVD tool, each of the wafers in the various chambers should have matching refractive indices, thicknesses, stress, etc. However, the operational parameters, e.g., radio frequency ("RF") power, silane flow, $N_2O$ flow, pressure, etc., for each chamber are manually set.

Variations in the manual settings, even within specified ranges, and the timing of the settings can result in variations among the wafers. These variations then are passed on to the next operation in the process flow, thereby complicating control in the next operation. Typically, the variations in one operations yield variations in the next, and the imperfection ripples throughout the process flow. Even where the variations do not produce fatal defects requiring the resulting semiconductor devices to be scrapped, they may cause variations in device performance.

The SPC techniques discussed above are proving ineffectual in dealing with this kind of problem, and the industry is looking for alternatives. One standard being formulated in the semiconductor fabrication industry is the Advanced Process Control ("APC") Framework ("APCFW"). The APC standard will provide run-to-run control of and fault detection in semiconductor processing equipment. However, the APC standard, although an improvement on traditional SPC techniques, also does not address the kind of inefficiencies and process difficulties discussed above.

The present invention is directed to overcoming, or at least reducing the effects of, one or more of the problems set forth above.

SUMMARY OF THE INVENTION

The invention, in its various aspects and embodiments, is a method and apparatus for controlling the operation of a multi-chamber process tool in a semiconductor fabrication process.

The method comprises setting a plurality of operation parameters for the conduct of a predetermined operation in each of a plurality of process chambers in a multi-chamber process tool; performing the predetermined operation in each of the process chambers; examining a physical characteristic of a processed wafer from each of the process chambers; determining from the examined physical characteristics whether the operating conditions in each of the process chambers match; and resetting at least one operating parameter so that the operating conditions in each of the process chambers will match.

The apparatus comprises a processing tool, a review station, and a tool controller. The processing tool includes a plurality of process chambers and an operation controller. Each process chamber is capable of performing a predetermined operation defined by a plurality of operating parameters. The operation controller is capable of setting the operating parameter for each of the process chambers. The review station is capable of examining a physical characteristic of a processed wafer from each of the process chambers and outputting the results of the examination. The tool controller is capable of receiving the examination result, determining whether the operating parameters of the process chambers match, and instructing the operation controller to reset at least some of the operating parameters responsive thereto to match the operating conditions in the process chambers.

BRIEF DESCRIPTION OF THE DRAWINGS

The invention may be understood by reference to the following description taken in conjunction with the accompanying drawings, in which like reference numerals identify like elements, and in which.

Figure 1:
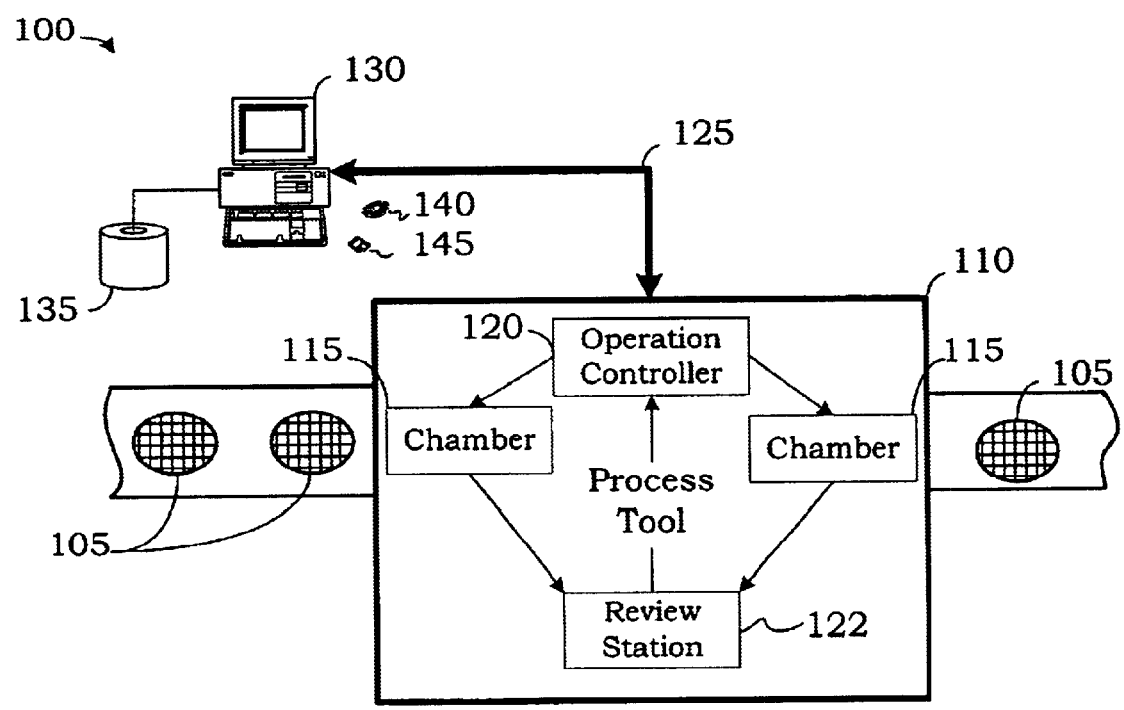
FIG. 1 illustrates semiconductor wafers being processed on a multi-chamber process tool, using a plurality of control input signals, in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives to falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Figure 2:
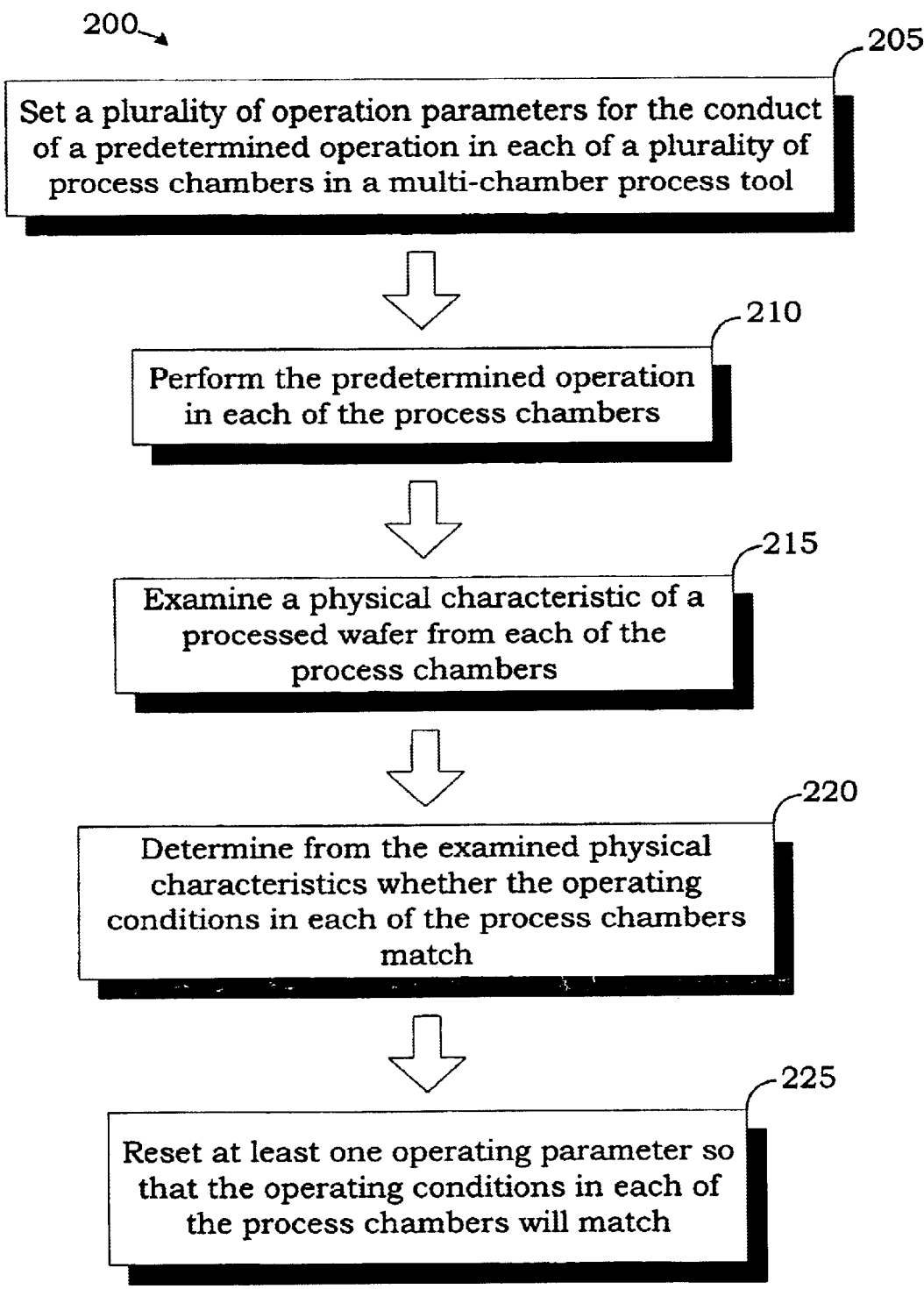
FIG. 2 illustrates a method for fabricating a semiconductor device practiced in accordance with the present invention.

FIG. 1 illustrates one particular apparatus 100 with which the method 200 may be practiced. FIG. 2 illustrates one particular embodiment of a method 200 practiced in accordance with the present invention. For the sake of clarity, and to further an understanding of the invention, the method 200 shall be disclosed in the context of the apparatus 100. However, the invention is not so limited and admits wide variation as is discussed further below.

FIG. 1 conceptually illustrates a lot of wafers 105 being processed through a multi-chamber process tool 110. The multi-chamber process tool 110 may be any multi-chamber process tool known to the art, e.g., a deposition tool or a rapid thermal processing ("RTP") tool. Three wafers 105 are shown in FIG. 1, but the lot of wafers, i.e., the "wafer lot," may be any practicable number of wafers from one to several thousand. The tool 110 includes a plurality of process chambers 115 in which the wafers 105 are subjected to a predetermined operation defined by a set of operating parameters. The predetermined operation may be any operation known to the art and will be implementation specific in various embodiments.

In the particular embodiment illustrated, there are two process chambers 115, although the invention is not so limited. As mentioned above, some multi-chamber process tools have as many as six chambers. The invention is not limited by the number of process chambers 115 so long as there are two or more. One or more wafers 105 are placed in each processing chamber 115 in parallel so that the operations in the process chambers 115 are performed in parallel. Thus, two groups of wafers 105 are processed through the tool 110 at a time during this particular process flow.

The tool 110 includes an operation controller 120 that sets, or controls, the operating parameters for a plurality of process chambers 115. The controlled operating parameters will be implementation specific dependent upon the operation performed in the process chambers 115. For instance, if the tool 110 is a chemical vapor deposition ("CVD") tool, the process chambers 115 will be "deposition chambers" in which a deposition operation occurs. If the tool 110 is a rapid thermal anneal ("RTA") tool, the process chambers 115 will be "ovens" in which an anneal operation occurs. Exemplary controlled operating parameters may include, for instance:

- in a CVD oxide deposition tool, the deposition time and the ratio of low frequency to high frequency radio frequency ("RF") power, which affect the oxide thickness and stress, respectively;
- in a metal deposition tool, deposition time or spacing between a wafer 105 and a target (not shown), which affect resistivity (or thickness) and uniformity, respectively;
- in a CVD oxy-nitride film tool, the nitrous oxide ($N_2O$) to silane flow, which affects the refractive index of the film;
- in a passivation nitride film tool, RF power settings, which affect stress; and
- in an RTA tool, the bulb power, or power to the bulbs, which affects the temperature profile and resistivity of wafers.

As those skilled in the art having the benefit of this disclosure will appreciate, the control and output parameters in these operations differ, but are well known. The controlled operating parameters are values representative of operating conditions physically manifested in the process chambers 115, e.g., pressure or temperature, or evident in the operation's conduct, e.g., etch time. The relationship between the controlled operating parameters and the operating conditions can usually be readily deduced.

The apparatus 100 also includes a review station 122. The review station 122, in the illustrated embodiment, is shown internal to the tool 110. However, as will be appreciated by those skilled in the art having the benefit of this disclosure, the review station 122 may be located external to the tool 110 in alternative embodiments. The scope of the invention is not limited by the location of the review station 122 relative to the tool 110. The review station 122 examines the physical characteristics of the wafers 105 after processing in the chambers 115. More particularly, the review station 122 examines physical characteristics upon which the effects of the operating parameters are known. Exemplary physical characteristics include, for instance, the refractive index of the wafer surface, stress resistance, and the thickness of deposited layers. These measurements are then output to the operation controller 115. Generally, the same physical characteristics are measured for the wafers 105 coming from the different process chambers 115.

The apparatus 100 also includes a tool controller 130, which is a programmed computer. The tool controller 130 performs the method 200 in FIG. 2 discussed more fully below. In the particular embodiment illustrated, the tool controller 130 is programmed with a software application program implementing the method 200. The application program is encoded on a hard disk 135 of the tool controller 130. However, the application program may be stored on any kind of computer-readable, program storage medium, such as an optical disk 140 or a floppy disk 145.

As is evident from the discussion above, some features of the present invention are implemented in software with which the computer 130 is programmed, either in whole or in part. Thus, some features of the present invention are implemented as instructions encoded on a computer-readable, program storage medium. The program storage medium may be of any type suitable to the particular implementation. However, the program storage medium will typically be magnetic, such as the floppy disk 145 or the hard disk drive 135, or optical, such as the optical disk 140. When these instructions are executed by the computer 130, they perform the disclosed functions. Similarly, the computer 130 may be a desktop computer. However, the computer 130 might alternatively be a processor embedded in the multi-chamber process tool 110. The computer 130 might also be a laptop, a workstation, or a mainframe in other embodiments. The scope of the invention is not limited by the type or nature of the program storage medium or computer with which it might be implemented.

Thus, some portions of the detailed descriptions herein are, or may be, presented in terms of algorithms, functions, techniques, or processes. These terms are the means used by those skilled in the art most effectively convey the substance of their work to others skilled in the art. These terms are here, and are generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated.

It has proven convenient at times, principally for reasons of common usage, to refer to these signals as bits, values, elements, symbols, characters, terms, numbers, or the like.

All of these and similar terms are to be associated with the appropriate physical quantities and are merely convenient labels applied to these quantities and actions. Unless specifically stated otherwise, or as may be apparent from the discussion, terms such as "processing," "computing," "calculating," "determining," "displaying," or the like, used herein refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Returning to FIG. 1, the tool controller 130 transmits the value for controlled operating parameters to the operation controller 120 of the tool 110 over the line 125. The operation controller 120 then sets the appropriate controls of the of the process chambers 115 and the wafers 105 are processed in the chambers 115. The review station 122 then examines the physical characteristics of the processed wafers 105 and outputs the information to the operation controller 120. The operation controller 120 then transmits this information to the tool controller 130 over the line 125. Generally speaking, the operation controller 130 then analyzes output of the review station 122 to determine whether the values of the controlled operating parameters need to be reset to match the conditions in the various process chambers 115. This examination/determination/reset is the implementation of the method 200 in FIG. 2.

Turning now to FIG. 2, the method 200 is one particular embodiment of a method to control the operation of a process tool in a semiconductor fabrication process. The method 200 begins by setting a plurality of operation parameters for the conduct of a predetermined operation in each of the process chambers 115 in the multi-chamber process tool 110, as set forth in box 205. Next, the tool 110 performs the predetermined operation in each of the process chambers 115 under the direction of the operation controller 120, as set forth in the box 210. After the operation is performed, the review station 122 examines a physical characteristic of a processed wafer from each of the process chambers 115, as set forth in the box 215. Next, as set forth in the box 220, the tool controller 130 determines from the examined physical characteristics whether the operating conditions in each of the process chambers 115 match. When the determination indicates that the operating conditions do not match, the tool controller 130 instructs the operation controller 120 to reset at least one operating parameter so that the operating conditions in each of the process chambers 115 will match.

As will be appreciated by those in the art having the benefit of this disclosure, a perfect match will seldom, if ever, be achieved. The ultimate goal is to achieve as high a uniformity as is practicable amongst the wafers 105 coming out of the various process chambers 115 so that the semiconductor devices produced from the wafers perform as uniformly as possible. Practice has shown that some variation in performance is tolerable. The amount of this tolerance will depend on a variety of factors, including the process used to produce the semiconductor device and the type of the device, e.g., a memory device or a processor. Thus, the term "match" as used herein means "match within production tolerance."

Also as will be appreciated by those in the art having the benefit of this disclosure, consideration will usually have to be given to tradeoffs in performance. More particularly, an action required to "match" one characteristic might cause another characteristic to become "unmatched." Thus, the consideration of whether there is a match and whether to alter controlled operating parameters should consider the affect such an alteration might have on other characteristics.

Such consideration of other characteristics may be handled in a variety of ways. For instance, production tolerances might be broadened so that matches might be found across a wider range of conditions. Or, the definition of a match might be made conditional, e.g., "if characteristic A differs by less than x and characteristic B differs by less than y, then there is a match; otherwise, no match." Alternatively, the range of conditions which are considered a match might be stored in a knowledge base (not shown), and accessed to find whether a match exists. Such a knowledge base might be built from experimental observations made during "design of experiment" qualification of a new machine before it is placed into commercial production flows. The knowledge base might also include a range of characteristics that are not a match, thus providing a capability for identifying new operating conditions requiring additional consideration or study. In some embodiments, the consideration might be handled by artificial intelligence systems inferencing on such a knowledge base. Yet another, simpler, approach reduces the relationship between or among the various characteristics to a mathematical equation, and then have the process controller manipulate the characteristics to minimize the mathematical solution to that equation.

Note that the approaches discussed above provide two notable advantages over conventional practice. First, various characteristics may readily be weighted relative to one another, e.g., a wider variation in one characteristic might be tolerated to achieve a narrower variation in another characteristic adjudged to be more important. Second, it permits a systematic and consistent application of quantified judgment to achieve more uniform results. Still other advantages may arise in various alternative implementations of the present invention.

As may be inferred from the discussion above, the method 200 may be applied either while the apparatus 100 is in commercial production or in the qualification of the apparatus 100 for commercial production. For one thing, it will be desirable to obtain uniform production even on the first wafer lot, and the process parameters will need to be matched to do this. Also, some operational parameters will need to be set and matched prior to commercial production because, inter alia, the wafer inspection for that particular characteristic is destructive. On the other hand, it may be desirable to monitor the tool 110's production to maintain matched settings once the tool goes into a commercial process flow. The present invention may be employed in either circumstance.

Each act in the method 200 is performed automatically, i.e., without manual intervention. The method 200 consequently provides quicker, more efficient, matching of process parameters in each of the processing chambers of an multi-chamber process tool. However, as implemented on the apparatus 100, these advantages are further leveraged to address problematical and significant needs in the art. For instance, because the tool controller 130 is, in the embodiment illustrated, a separate computer from the operation controller 120, the invention can be used to retrofit existing fabrication process equipment. Also, in embodiments in which the invention is employed in an APC system, such as those discussed further below, the invention provides desired flexibility, modularity, and scalability in a standards-based environment that presents a significant advance over the state of the art.

An Exemplary Embodiment

Figure 3:
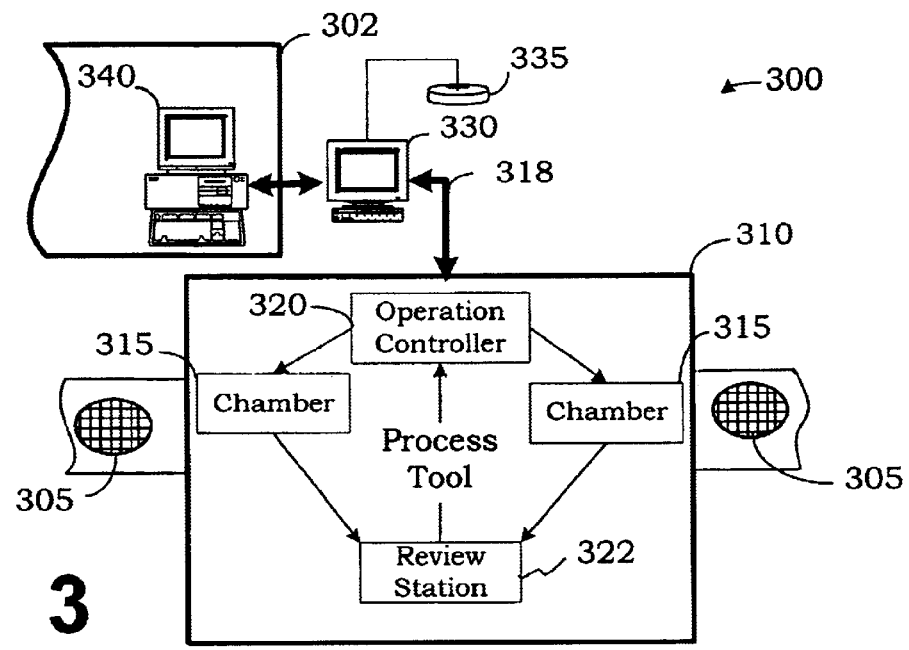
FIGS. 3–4 illustrate one particular embodiment of the tool in FIG. 1.
Figure 4:
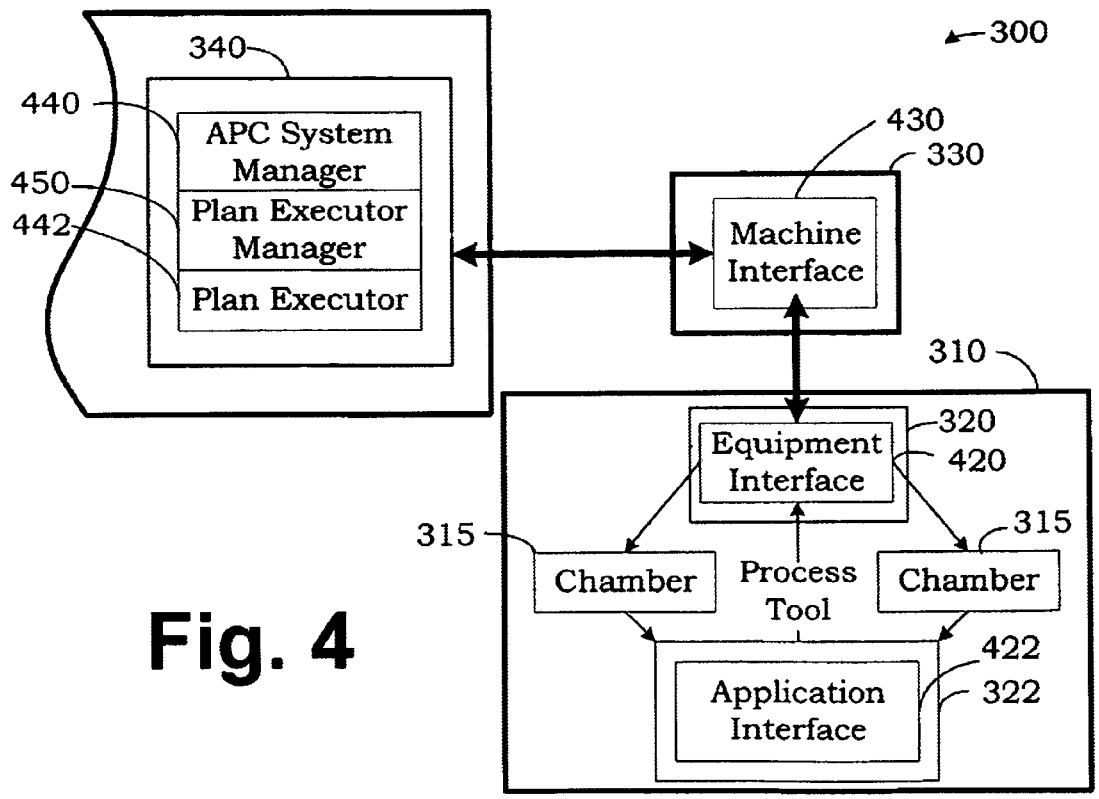
Figure 5:
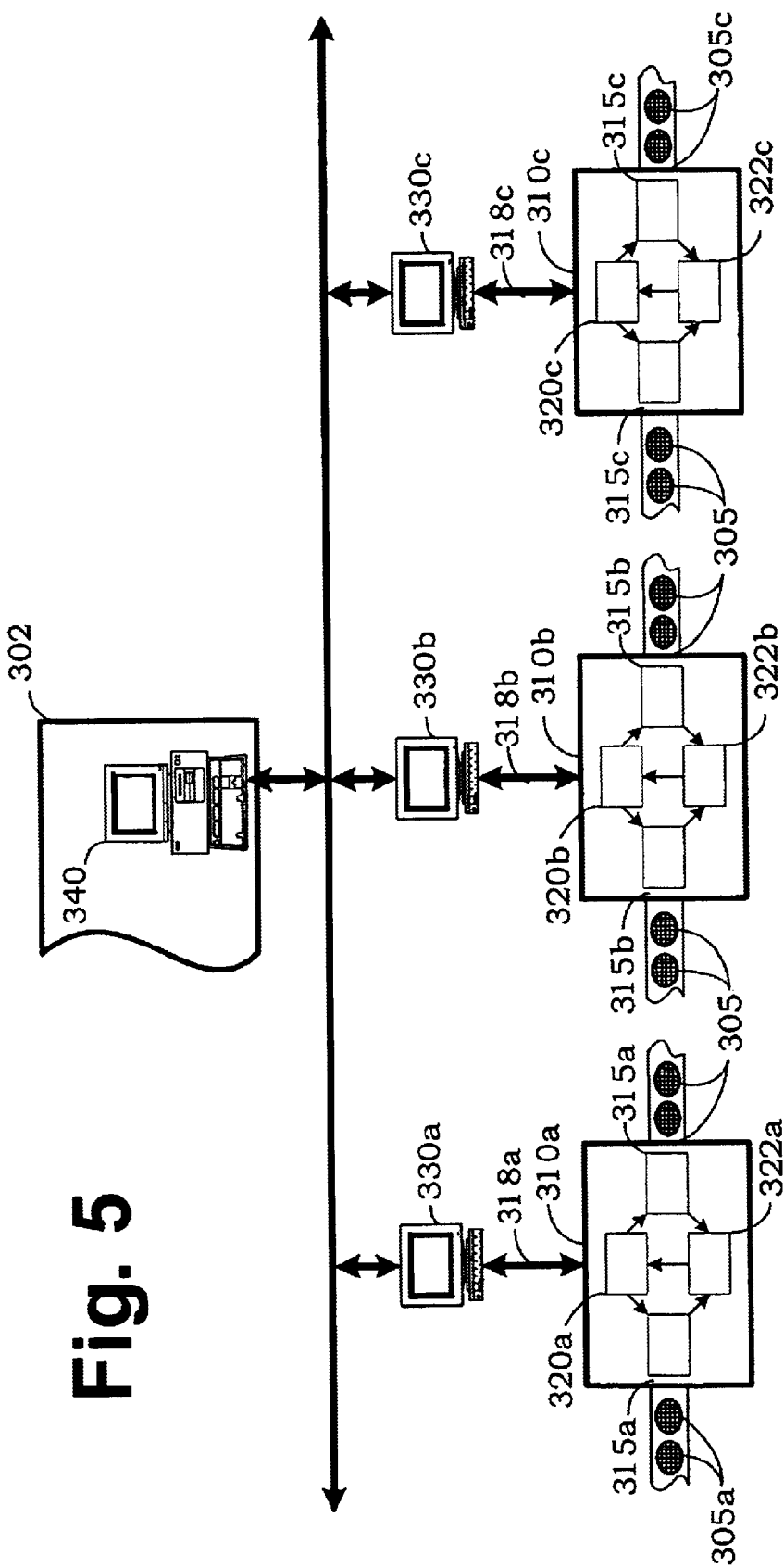
FIG. 5 depicts a fabrication process flow including several processing tools such as the one illustrated in FIGS. 3–4.

An exemplary embodiment of the invention is illustrated in FIGS. 3–5, in which an apparatus 300 comprises a portion of an Advanced Process Control Framework ("APCFW") system. The APC System is a distributed software system made up of interchangeable, standardized software components permitting run-to-run control and fault detection/classification and implementing an architectural standard. It is standards-based, and is modeled on the architecture of the SEMATECH CIM Framework. The apparatus 300 includes one particular embodiment of the apparatus 100 in FIG. 1, and like parts bear like numbers. The APC system uses the Object Management Group's ("OMG") Common Object Request Broker Architecture ("CORBA") and CORBA_Services specifications for distributed object systems. The components communicate with each other using the CORBA Interface Definition Language ("IDL") interfaces. The cooperating software components manage process control plans/strategies; collect data from process equipment, metrology tools, and sensor(s); invoke various process control applications/algorithms with this information; and update process models and modify/download recipe parameters as appropriate.

The apparatus 300 comprises a portion of an APC system 302 not otherwise shown. FIGS. 3–4 are conceptualized structural and functional block diagrams, respectively, of the apparatus 300. A set of processing steps is performed on a lot of wafers 305 by a fabrication tool 310. In this embodiment, the fabrication tool 310 performs heat treatment operations, particularly deposition operations, like CVD. However, alternative embodiments may perform other operations as noted above.

Referring now to both FIGS. 3 and 4, the fabrication tool 310 communicates with the rest of a APC system 302. The APC system 302 implements an APC manufacturing framework comprising a network of "integration components." "Integration components" are software implemented interfaces to existing factory systems and provide capabilities for running APC Plans that define various aspects of the process flow. One such integration component is the APC System manager 440 resident on the APC host computer 340. Other integration components include, but are not necessarily limited to the equipment interface 420 resident on the tool 310, the machine interface 430 resident on the workstation 330, and the application interface 422 resident on the review station 322.

In the present embodiment, the APC System manager 440 provides:
  administrative, configuration, event, and state services for all servers developed for the APCFW.
  definition, grouping, installation, and management of the components in the APC System.
  centralized services for capturing activity and trace information, for diagnostic and monitoring purposes.
  a centralized repository of component configuration information, including setup values, system environment settings, and lists of dependent objects and event channels.

However, in alternative embodiments, these functions may be divided into one or more software components, e.g., a base manager, a system manager, a logger, and a registry.

In this particular embodiment, the APC System also includes a Plan Execution Manager ("PEM") 450, which is the component primarily responsible for "choreographing" the operation of the APC System 302. This involves interpreting APC Plans, executing main to scripts, and subscripts, and invoking event scripts as events dictate. A variety of plans, scripts, and subscripts may be used in various implementations. For instance, the present embodiment includes, but is not limited to, the following plans:
  data collection plan—a data structure used exclusively by a sensor interface and machine interface defined by the PEM 450, the requirements in which what data should be collected from a specific processing equipment, and how that data should be reported back to PEM 450;
  duration plan—defines the trigger conditions and the delays when triggers (i.e., conditions that cause the tool's sensors to act upon, e.g., start data collection, stop data collection) happen;
  reporting plan—defines what to do with the collected data, as well as when to signal the data's availability; and
  sampling plan—defines the frequency at which the data is to be collected by the external sensor;

However, the number and function of various plans, scripts, and subscripts will be implementation specific.

The PEM 450 coordinates the execution of user-defined process control plans among all the integration components for a given fabrication tool, such as the tool 310. When instructed, the PEM 450 retrieves a plan and its associated scripts. It preprocesses subscripts to provide routines to main and event scripts. It also obtains a list of the capabilities necessary to execute the plan, as specified in the plan and connects to the proper integration components providing the required capabilities.

The PEM 450 then delegates responsibility to run the plan to a Plan Executor ("PE") 422. The PE 422 sequentially executes the plan and reports completion of the plan or errors in the execution of the plan to the PEM 450. Thus, while the PEM 450 is responsible for the overall management of all plans executed, a PE 422 is responsible for running only one plan. The PE 422 is created by the PEM 450, exists for the life of the plan, and is destroyed by the PEM 450 after reporting that the plan is completed or aborted. Each PE 422 executes a main script and zero or more event scripts. The PEM 450 can start multiple plans concurrently via multiple Plan Executors.

The machine interface 430 resides on the workstation 330. The machine interface 430 bridges the gap between portions of the APC System 302 (e.g., the APC system manager 440) and the equipment interface 420. Thus, the machine interface 430 interfaces the fabrication tool 310 with the APC System 302 and supports machine setup, activation, monitoring, and data collection. The machine interface 430 primarily translates between specific communications of the equipment interface 420 and CORBA communications of the APC System 302. More particularly, the machine interface 430 receives commands, status events, and collected data from the equipment interface 420 and forwards them, as needed, to other APC components and event channels. In turn, responses from APC components are received by the machine interface 430 and routed to the equipment interface 420. The machine interface 430 also reformats and restructures messages and data, as necessary. The machine interface 430 supports the startup/shutdown procedures within the APC System Manager 440. It also serves as an APC data collector, buffering data collected by the equipment interface 420 and emitting appropriate data collection events.

Each of the integration components, e.g., the APC system manager 440, the equipment interface 420, the application interface 422, and the machine interface 430 are, in this particular embodiment, software-implemented. They are programmed in C++ using object-oriented programming techniques as are known in the art. In object-oriented programming, an object is a self-contained entity created in code that consists of both data and procedures to manipulate the data. Objects may be grouped into classes, with each class being defined by the properties common to all the objects in the class. Some objects may include properties not found in other objects within the same class. One common property used in defining a class are the methods employed by the objects of the class. A method is really the same as a procedure, function, or routine in commonly encountered in other, more traditional procedural programming languages. Thus, a method is a section of a program that performs a specific task. An object performs, or calls, a method when it receives a message from another object, regardless of whether that object is of the same class.

The integration components rely on a common set of services to support their interaction. A standard set of distributed-object services are defined by the Object Management Group ("OMG"). Among these services are:

CORBA—the standard-based communications used for all direct component-to-component interaction. Standard interfaces can be defined according to an object-oriented, remote invocation communications model. These interfaces and all APC communications are defined using IDL. Components communicate by invoking operations on each others interfaces. Data is passed between components as operation parameters and return values.

OMG Event Service—supports asynchronous communications between components. Many of the APC objects emit events as they change state. These events are received by interested event subscribers. Examples of event usage within the APC system include, but are not limited to, communication component state (including error state), notification of fault alarms detected by fault detection and classification software, and reporting of machine status and collected data.

OMG Trading Services enables a component to find another component with which to interact. When a component is installed, a description of its services (a services offer) is exported to the Trading Service. Another component can later request a list of service providers that meet certain criteria. The Trading Service supplies a list of other components that can provide the requested service. That capability is used upon component startup to allow one component to find other components with which it must interact. It is also used upon Plan Startup when a Plan Execution component needs to find Capability Providers to provide the required capabilities specified in the plan.

These services are well known in the art. OMG's CORBA/IIOP Specifications document and CORBA Services Specifications documents are widely distributed among those in the art and provide greater detail.

Thus, in the particular embodiment illustrated, the APC system is a factory-wide software system, but this is not necessary to the practice of the invention. The strategies taught by the present invention can be applied to virtually any semiconductor fabrication tool on a factory floor. Indeed, the present invention may be simultaneously employed on multiple fabrication tools in the same factory or in the same fabrication process. The APCFW permits remote access and monitoring of the process performance. Furthermore, by utilizing the APCFW, data storage can be more convenient, more flexible, and less expensive than local drives. However, the invention may be employed, in some alternative embodiments, on local drives.

Because the apparatus 300 is part of an APC system, the wafers 305 are processed on a run-to-run basis. A "run" may be a lot, a batch of lots, or even an individual wafer 305. Overall operation of the fabrication tool 310 within the APC system is directed by an APC System Manager 440 resident on the APC host computer 340. The APC System Manager 440 controls the fabrication process by implementing one or more "plans". The method 200, and variations thereon, are implemented on the tool 310 by the APC System Manager 440. The APC System manager 440, through a Plan Executor ("PE") 422, sends a Data Collection Plan ("DCPlan") to the application interface 422 before data collection begins at the review station 322. The DCPlan contains all the pertinent information for the data collection to the review station 322. The pertinent information may include duration plan, sampling plan, observables, triggers, and limits (i.e., the setpoint or value defining the trigger). This pertinent information includes the identity of the physical characteristics of the wafers to be examined. The application interface 422 forwards the desired data from the process tool 310, in a predefined format and in predetermined time interval back to the PE 422 through the equipment interface 420. Multiple DCPlans can be executed in parallel, each with their own PE 442, and are managed by the PEM 450.

A Process Flow Employing the Exemplary Embodiment

FIG. 5 depicts a fabrication process flow including several processing tools such as the one illustrated in FIGS. 3–4. In this particular embodiment, the method 200 is implemented on several tools 310a–c during commercial production. The modularity, scalability, and flexibility of the exemplary embodiment 300 in FIGS. 2–4 is amply demonstrated. The single APC system manager on the APC host computer 340 can issue directives from a centralized location to each of the processing tools. The APC system also employs many standards. The modular integration components for each machine allow the APC system manager to manage the entire process flow. This is true even if the tools 310a–c are different kinds of tools performing different operations.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An apparatus for fabricating semiconductor devices, the apparatus comprising:

a processing tool including:
 a plurality of process chambers, each capable of performing a predetermined operation defined by a plurality of operating parameters; and
 an operation controller capable of setting the operating parameters for each of the process chambers; and
a review station capable of examining a physical characteristic of a processed wafer from each of the process chambers and outputting a result of the examination; and a tool controller capable of receiving the examination result, determining whether the operating parameters of the process chambers match, and instructing the operation controller to reset at least some of the operating parameters responsive thereto to match the operating conditions in the process chambers.

2. The apparatus of claim 1, wherein the processing tool comprises one of a deposition tool and a rapid thermal processing tool.

3. The apparatus of claim 2, wherein the processing tool comprises one of a chemical vapor deposition tool and a metal deposition tool.

4. The apparatus of claim 3, wherein the process chambers comprise deposition chambers.

5. The apparatus of claim 3, wherein the operating parameters include at least one of RF power, silane flow, $N_2O$ flow, temperature, pressure, deposition time, spacing between the wafer and the target, DC bias, and etch time.

6. The apparatus of claim 3, wherein the physical characteristic comprises one of oxide thickness, resistivity, uniformity, refractive index, stress, and temperature profile.

7. The apparatus of claim 2, wherein the rapid thermal processing tool comprises one of a rapid thermal oxidizing tool and a rapid thermal anneal tool.

8. The apparatus of claim 7, wherein the process chambers comprise ovens.

9. The apparatus of claim 1, wherein the operating parameters include at least one of RF power, silane flow, $N_2O$ flow, temperature, pressure, deposition time, spacing between the wafer and the target, DC bias, and etch time.

10. The apparatus of claim 1, wherein the physical characteristic comprises one of oxide thickness, resistivity, uniformity, refractive index, stress, and temperature profile.

11. The apparatus of claim 1, wherein the review station is internal to the processing tool.

12. The apparatus of claim 1, wherein the operation controller comprises a programmed computer.

13. The apparatus of claim 12, wherein the programmed computer comprises one of an embedded processor, a desktop personal computer, a laptop, a workstation, and a mainframe.

14. The apparatus of claim 1, wherein the tool controller is a programmed computer.

15. The apparatus of claim 14, wherein the programmed computer comprises one of an embedded processor, a desktop personal computer, a laptop, a workstation, and a mainframe.

16. An apparatus for fabricating semiconductor devices, the apparatus comprising:
a processing tool including:
a plurality of means for processing wafers, each processing means being capable of performing a predetermined operation defined by a plurality of operating parameters; and
means for setting the operating parameters for each of the processing means; and
means for examining a physical characteristic of a processed wafer from each of the process chambers and outputting a result of the examination; and
a tool controller capable of receiving the examination result, determining whether the operating parameters of the processing means match, and instructing the setting means to reset at least some of the operating parameters responsive thereto to match the operating conditions in the processing means.

17. The apparatus of claim 16, wherein the processing tool comprises one of a deposition tool and a rapid thermal processing tool.

18. The apparatus of claim 17, wherein the deposition tool comprises one of a chemical vapor deposition tool and a metal deposition tool.

19. The apparatus of claim 18, wherein the processing means comprise deposition chambers.

20. The apparatus of claim 18, wherein the operating parameters include at least one of RF power, silane flow, $N_2O$ flow, temperature, pressure, deposition time, spacing between the wafer and the target, DC bias, and etch time.

21. The apparatus of claim 18, wherein the physical characteristic comprises one of oxide thickness, resistivity, uniformity, refractive index, stress, and temperature profile.

22. The apparatus of claim 17, wherein the rapid thermal processing tool comprises one of a rapid thermal oxidizing tool and a rapid thermal anneal tool.

23. The apparatus of claim 22, wherein the processing means comprise ovens.

24. The apparatus of claim 16, wherein the operating parameters include at least one of RF power, silane, flow, $N_2O$ flow, temperature, pressure, deposition time, spacing between the wafer and the target, DC bias, and etch time.

25. The apparatus of claim 16, wherein the physical characteristic comprises one of oxide thickness, resistivity, uniformity, refractive index, stress, and temperature profile.

26. The apparatus of claim 16, wherein the examining means is internal to the processing tool.

27. The apparatus of claim 16, wherein the setting means comprises a programmed computer.

28. The apparatus of claim 27, wherein the programmed computer comprises one of an embedded processor, a desktop personal computer, a laptop, a workstation, and a mainframe.

29. The apparatus of claim 16, wherein the tool controller is a programmed computer.

30. The apparatus of claim 29, wherein the programmed computer comprises one of an embedded processor, a desktop personal computer, a laptop, a workstation, and a mainframe.

31. A method for controlling the operation of a process tool in a semiconductor fabrication process, the method comprising:
setting a plurality of operation parameters for the conduct of a predetermined operation in each of a plurality of process chambers in a multi-chamber process tool;
performing the predetermined operation in each of the process chambers;
examining a physical characteristic of a processed wafer from each of the process chambers;
determining from the examined physical characteristic whether the operating conditions in each of the process chambers match; and
resetting at least one operating parameter so that the operating conditions in each of the process chambers will match.

32. The method of claim 31, wherein the operating parameters include at least one of RF power, silane flow, $N_2O$ flow, temperature, pressure, deposition time, spacing between the wafer and the target, DC bias, and etch time.

33. The method of claim 31, wherein the physical characteristic comprises one of oxide thickness, resistivity, uniformity, refractive index, stress, and temperature profile.

34. A computer-readable, program storage medium encoded with instructions that, when executed by a computer, perform a method comprising:
examining a physical characteristic of a processed wafer from each of a plurality of process chambers in a fabrication tool; and determining from the examined physical characteristic whether the operating conditions in each of the process chambers match; and resetting at least one operating parameter so that the operating conditions in each of the process chambers will match.

35. The computer-readable, program storage medium of claim 34, wherein the program storage medium is an electromagnetic program storage medium.

36. The computer-readable, program storage medium of claim 35, wherein the electromagnetic program storage medium is one of a hard disk, a floppy disk, and a tape.

37. The computer-readable, program storage medium of claim 34, wherein the program storage medium is an optical program storage medium.

38. The computer-readable, program storage medium of claim 37, wherein the optical program storage medium is an optical disk.

39. The computer-readable, program storage medium of claim 34, wherein the operating parameters include at least one of RF power, silane flow, $N_2O$ flow, temperature, pressure, deposition time, spacing between the wafer and the target, DC bias, and etch time.

40. The computer-readable, program storage medium of claim 34, wherein the physical characteristic comprises one of oxide thickness, resistivity, uniformity, refractive index, stress, and temperature profile.

41. A computer programmed to control a wafer fabrication process, wherein the computer is programmed to perform a method comprising:

examining a physical characteristic of a processed wafer from each of a plurality of process chambers in a fabrication tool; and determining from the examined physical characteristic whether the operating conditions in each of the process chambers match; and resetting at least one operating parameter so that the operating conditions in each of the process chambers will match.

42. The programmed computer of claim 41, wherein the programmed computer comprises one of an embedded processor, a desktop personal computer, a laptop, a workstation, and a mainframe.

43. The programmed computer of claim 41, wherein the operating parameters include at least one of RD power, silane flow, $N_2O$ flow, temperature, pressure, deposition time, spacing between the wafer and the target, DC bias, and etch time.

44. The programmed computer of claim 41, wherein the physical characteristic comprises one of oxide thickness, resistivity, uniformity, refractive index, stress, and temperature profile.

45. A apparatus, comprising:

a processing tool including:
a plurality of process chambers, each capable of performing a predetermined operation defined by a plurality of operating parameters; and
an operation controller capable of setting the operating parameters for each of the process chambers; and a review station capable of examining a physical characteristic of a processed wafer from each of the process chambers and outputting a result of the examination; and a computer system, including:
a tool controller capable of receiving the examination result, determining whether the operating parameters of the process chambers match, and instructing the operation controller to reset at least some of the operating parameters responsive thereto to match the operating conditions in the process chambers.

46. The apparatus of claim 45, wherein the processing tool comprises one of a deposition tool and a rapid thermal processing tool.

47. The apparatus of claim 46, wherein the deposition tool comprises one of a chemical vapor deposition tool and a metal deposition tool.

48. The apparatus of claim 47, wherein the process chambers comprise deposition chambers.

49. The apparatus of claim 47, wherein the operating parameters include at least one of RF power, silane flow, $N_2O$ flow, temperature, pressure, deposition time, spacing between the wafer and the target, DC bias, and etch time.

50. The apparatus of claim 47, wherein the physical characteristic comprises one of oxide thickness, resistivity, uniformity, refractive index, stress, and temperature profile.

51. The apparatus of claim 46, wherein the rapid thermal processing tool comprises one of a rapid thermal oxidizing tool and a rapid tonal anneal tool.

52. The apparatus of claim 51, wherein the process chambers comprise ovens.

53. The apparatus of claim 45, wherein the operating parameters include at least one of RF power, silane flow, $N_2O$ flow, temperature, pressure, deposition time, spacing between the wafer and the target, DC bias, and etch time.

54. The apparatus of claim 45, wherein the physical characteristic comprises one of oxide thickness, resistivity, uniformity, refractive index, stress, and temperature profile.

55. The apparatus of claim 45, wherein the tool sensors include at least one of a temperature gauge, a timer, and a pressure sensor.

56. The apparatus of claim 45, wherein the operation controller comprises a programmed computer.

57. The apparatus of claim 56, wherein the programmed computer comprises one of an embedded processor, a desktop persona computer, a laptop, a workstation, and a mainframe.

58. The apparatus of claim 45, wherein the tool controller is a programmed computer.

59. The apparatus of claim 58, wherein the programmed computer comprises one of an embedded processor, a desktop personal computer, a laptop, a workstation, and a mainframe.

* * * * *

UNITED STATES PATENT AND TRADEMARK OFFICE
CERTIFICATE OF CORRECTION

PATENT NO. : 6,684,122 B1
DATED : January 27, 2004
INVENTOR(S) : Craig W. Christian, Bradley M. Davis, Allen L. Evans It is certified that error appears in the above-identified patent and that said Letters Patent is hereby corrected as shown below:

<u>Column 16,.</u>
Line 49, "persona" should be -- personal. --

Signed and Sealed this

Twenty-second Day of June, 2004

JON W. DUDAS
*Acting Director of the United States Patent and Trademark Office*